United States Patent
Wang et al.

(10) Patent No.: US 6,309,959 B1
(45) Date of Patent: Oct. 30, 2001

(54) FORMATION OF SELF-ALIGNED PASSIVATION FOR INTERCONNECT TO MINIMIZE ELECTROMIGRATION

(75) Inventors: Pin-Chin C. Wang, Menlo Park; Lu You, Santa Clara; Joffre Bernard, Santa Clara; Amit Marathe, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/630,943

(22) Filed: Aug. 3, 2000

(51) Int. Cl.$^7$ ................................................. H01L 21/4763
(52) U.S. Cl. .................... 438/625; 438/626; 438/629; 438/633; 438/637; 438/640; 438/643; 438/648; 438/660; 438/687
(58) Field of Search ..................................... 438/597, 625, 438/626, 629, 633, 637, 640, 643, 648, 660, 687

(56) References Cited

U.S. PATENT DOCUMENTS 6,228,759 * 5/2001 Wang et al. ........................ 438/625
6,261,963 * 7/2001 Zhao et al. ......................... 438/704

* cited by examiner

*Primary Examiner*—Long Pham
(74) *Attorney, Agent, or Firm*—Monica H. Choi

(57) ABSTRACT

An interconnect opening of an integrated circuit is filled with a conductive fill with the interconnect opening being within an insulating layer on a semiconductor wafer. A seed layer of a first conductive material is deposited conformally onto sidewalls and a bottom wall of the interconnect opening. The interconnect opening is further filled with a second conductive material by growing the second conductive material from the seed layer to form a conductive fill of the first conductive material and the second conductive material within the interconnect opening. The first conductive material and the second conductive material are comprised of a bulk metal, and at least one of the first conductive material and the second conductive material is a metal alloy having an alloy dopant in the bulk metal. In addition, a plasma treatment process is performed to remove any metal oxide or metal hydroxide from a top surface of the conductive fill. A self-aligned passivation material of an intermetallic compound or a metal oxide is formed at the top surface of the conductive fill with the alloy dopant that segregates out and to the top surface of the conductive fill. The intermetallic compound or the metal oxide is an additional passivation material between the top surface of the conductive fill and a layer of bulk passivation material deposited over the semiconductor wafer to prevent drift of the bulk metal, such as copper, of the conductive fill along a bottom surface of the layer of bulk passivation material.

19 Claims, 6 Drawing Sheets

FORMATION OF SELF-ALIGNED PASSIVATION FOR INTERCONNECT TO MINIMIZE ELECTROMIGRATION

TECHNICAL FIELD

The present invention relates generally to fabrication of interconnects within integrated circuits, and more particularly, to formation of a self-aligned passivation material at the top surface of the interconnect, such as copper interconnect for example, to effectively encapsulate the interconnect for preventing material comprising the interconnect from drifting into surrounding insulating material.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Figure 1:
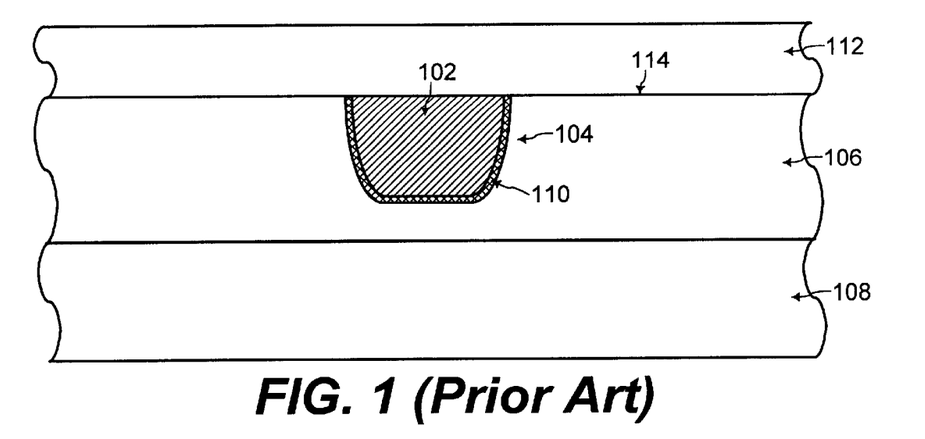
FIG. 1 shows a cross-sectional view of a copper interconnect formed by copper filling a trench within an insulating layer, according to the prior art.

Referring to FIG. 1, a cross sectional view is shown of a copper interconnect 102 within a trench 104 formed in an insulating layer 106. The copper interconnect 102 within the insulating layer 106 is formed on a semiconductor wafer 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

Referring to FIG. 1, in the prior art, the encapsulating layer 112 of silicon nitride is deposited directly onto an exposed surface of the copper interconnect 102 and the surrounding insulating layer 106 after the exposed surface of the copper interconnect 102 and the surrounding insulating layer 106 are polished to a level surface. Unfortunately, the silicon nitride of the encapsulating layer 112 does not bond well to the copper at the exposed surface of the copper interconnect 102.

Thus, although copper does not diffuse easily through the encapsulating layer 112 of silicon nitride, copper from the copper interconnect 102 laterally drifts from the interface between the copper interconnect 102 and the encapsulating layer 112 of silicon nitride along the bottom surface 114 of the encapsulating layer 112 of silicon nitride because of the weak bonding of the copper interconnect 102 and the encapsulating layer 112 of silicon nitride.

The copper that laterally drifts from the interface between the copper interconnect 102 and the encapsulating layer 112 of silicon nitride along the bottom surface 114 of the encapsulating layer 112 eventually diffuses into the insulating layer 106 to disadvantageously degrade the insulating property of the insulating layer 106 and to possibly degrade the copper interconnect electromigration life-time. Nevertheless, use of copper metallization is desirable for further scaling down integrated circuit dimensions because of the lower bulk resistivity and the higher electromigration tolerance. Thus, a mechanism is desired for preventing the drift of copper from the copper interconnect 102 into the insulating layer 106.

SUMMARY OF THE INVENTION

Accordingly, in a general aspect of the present invention, an additional passivation material that is more reliable than just a bulk passivation layer is formed to be self-aligned at the top surface of the interconnect, such as copper interconnect for example, to effectively encapsulate the interconnect for preventing material comprising the interconnect from drifting into surrounding insulating material.

In one aspect of the present invention, an interconnect opening of an integrated circuit is filled with a conductive fill with the interconnect opening being within an insulating layer on a semiconductor wafer. A seed layer of a first conductive material is deposited conformally onto sidewalls and a bottom wall of the interconnect opening. The interconnect opening is further filled with a second conductive material by growing the second conductive material from the seed layer, to form a conductive fill of the first conductive material and the second conductive material within the interconnect opening.

The first conductive material and the second conductive material are comprised of a bulk metal, and at least one of the first conductive material and the second conductive material is a metal alloy having an alloy dopant in the bulk metal. The first conductive material and the second conductive material are polished away from the insulating layer surrounding the interconnect opening such that the conductive fill is contained within the interconnect opening. In addition, a plasma treatment process is performed by placing the semiconductor wafer within a plasma reaction chamber with a reducing agent to remove any native metal oxide or native metal hydroxide from a top surface of the conductive fill. "native" metal oxide and "native" metal hydroxide refers to metal oxide and metal hydroxide that forms uncontrollably from reactants in the ambient, as known to one of ordinary skill in the art of integrated circuit fabrication.

In a first embodiment of the present invention, for forming a self-aligned passivation material of an intermetallic compound at the top surface of the conductive fill, a layer of bulk passivation material is formed over the top surface of the conductive fill in a PVD (plasma vapor deposition) process while the semiconductor wafer is placed within the plasma reaction chamber after the prior step of the plasma treatment process. An anneal is then performed by heating up the semiconductor wafer such that the alloy dopant of the conductive fill segregates out of the conductive fill to the top surface of the conductive fill to form an intermetallic compound from a reaction of the alloy dopant with the bulk metal at an interface between the layer of bulk passivation material and the top surface of the conductive fill.

The intermetallic compound is formed with the conductive fill being exposed to substantially zero oxygen since the layer of bulk passivation material covers the conductive fill during the anneal. In addition, the intermetallic compound is formed to be self-aligned over substantially only the top surface of the conductive fill to prevent drift of the bulk metal of the conductive fill along a bottom surface of the layer of bulk passivation material.

In a second embodiment of the present invention, an additional passivation material of metal oxide is formed to be self aligned on the top surface of the conductive fill. In this second embodiment of the present invention, after the plasma treatment process for removing any native metal oxide or native metal hydroxide from a top surface of the conductive fill, the top surface of the conductive fill is exposed to an oxygen plasma to form a high quality metal oxide, that is more dense than any native metal oxide, on the top surface of the conductive fill from a reaction of the oxygen plasma with the alloy dopant that segregates to the top surface of the conductive fill during this reaction. A layer of bulk passivation material is then deposited over the metal oxide formed on the top surface of the conductive fill. The metal oxide is formed to be self-aligned over substantially only the top surface of the conductive fill to prevent drift of the bulk metal of the conductive fill along a bottom surface of the layer of bulk passivation material.

The present invention may be used to particular advantage when the insulating layer is comprised of silicon dioxide ($SiO_2$), and when the layer of bulk passivation material is comprised of silicon nitride ($Si_3N_4$), and when the bulk metal is copper, and when at least one of the first conductive material and the second conductive material is comprised of a copper alloy with the alloy dopant being indium as one example.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

The present invention is described for formation of copper interconnect. However, the present invention may be practiced for preventing drift of material from other types of interconnects into the surrounding insulating layer, as would be apparent to one of ordinary skill in the art of integrated circuit fabrication from the description herein.

Figure 2:
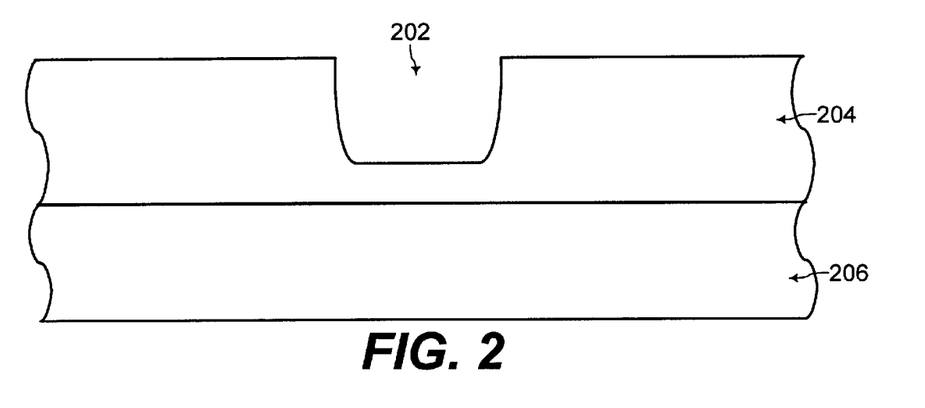
FIGS. 2, 3, 4, 5, 6, 7, and 8 show cross-sectional views for formation of an interconnect to illustrate process steps for forming a conductive fill within an interconnect opening that is formed in an insulating layer with the top surface of the conductive fill being treated with a reducing plasma, according to one aspect of the present invention.

Referring to FIG. 2, for forming an interconnect such as copper interconnect, an interconnect opening 202 such as a trench line is formed within an insulating layer 204 on a semiconductor wafer 206 as part of an integrated circuit, as known to one of ordinary skill in the art of integrated circuit fabrication. Typically, the semiconductor wafer 206 is comprised of silicon (Si), and the insulating layer 204 is comprised of silicon dioxide ($SiO_2$) or a low dielectric constant insulating material such as organic doped silica, as known to one of ordinary skill in the art of integrated circuit fabrication.

Copper interconnect is desirable for metallization within an integrated circuit with scaled down dimensions because copper has lower bulk resistivity and potentially higher electromigration tolerance than aluminum. However, because copper is not a volatile metal, copper cannot be easily etched away in a deposition and etching process as typically used for aluminum metallization. Thus, copper interconnect is typically formed by etching the interconnect opening 202 within the insulating layer 204 and then filling the interconnect opening 202 with copper fill.

Figure 3:
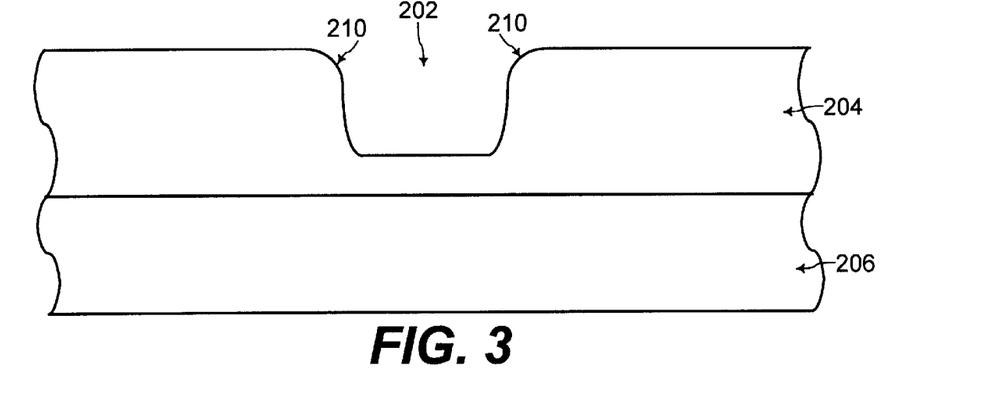

Referring to FIG. 3, the top corner 210 of the interconnect opening 202 is rounded by a sputtering process. Sputtering processes are known to one of ordinary skill in the art of integrated circuit fabrication.

Figure 4:
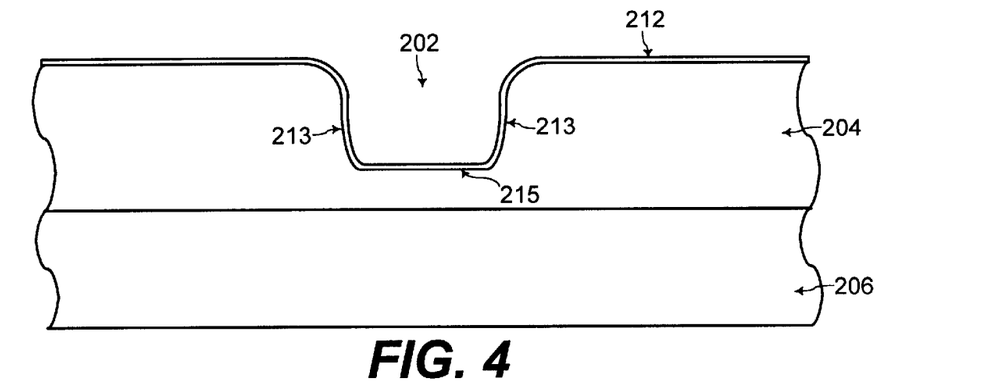

Referring to FIG. 4, a diffusion barrier layer 212 is deposited on the exposed surfaces of the insulating layer 204 including the sidewalls 213 and the bottom wall 215 of the interconnect opening 202. The diffusion barrier layer 212 is comprised of a diffusion barrier material that prevents diffusion of copper to be filled within the interconnect opening 202 into the surrounding insulating layer 204. Such diffusion barrier materials and processes for deposition of such diffusion barrier materials are known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 2, the insulating layer 204 is typically comprised of silicon dioxide or a low dielectric constant insulating material such as organic doped silica, as known to one of ordinary skill in the art of integrated circuit fabrication, especially when the semiconductor wafer 206 is a silicon substrate.

Copper may easily diffuse into the insulating layer 204, and this diffusion of copper may degrade the performance of the integrated circuit. Thus, the first diffusion barrier layer 212 is deposited to surround the copper to be filled within the interconnect opening 202. The diffusion barrier layer 212 prevents diffusion of copper to filled within the interconnect opening 202 to the insulating layer 204 to preserve the integrity of the insulating layer 204.

Figure 5:
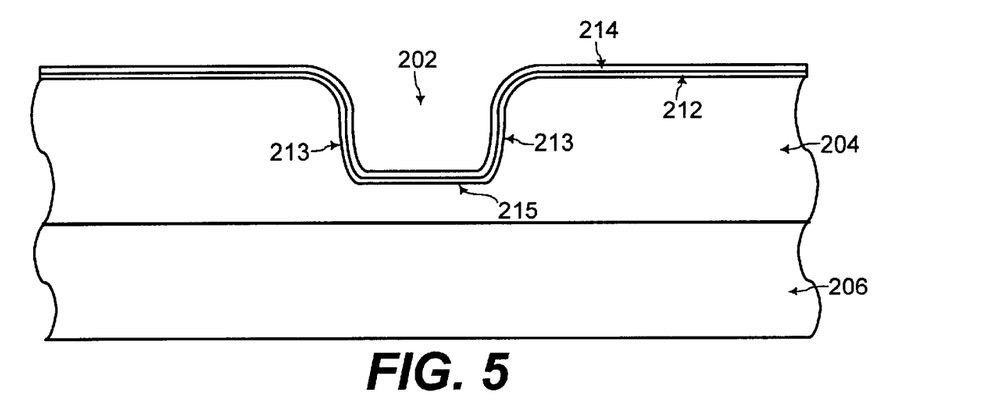
Figure 6:
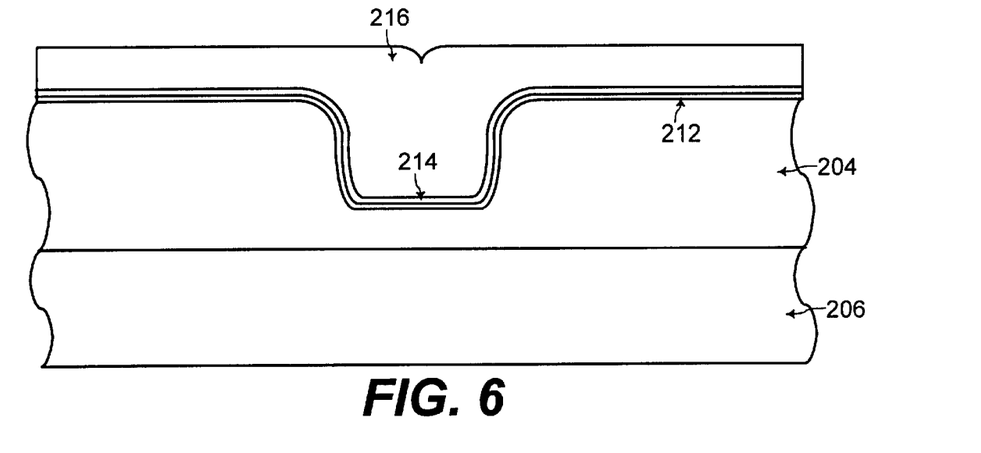

Referring to FIG. 5, a copper seed layer 214 of a first conductive material is conformally deposited on the diffusion barrier layer 212. Processes for conformal deposition of the copper seed layer 214, such as CVD (chemical vapor deposition), IMP (ionized metal plasma) deposition, and continuous PVD (physical vapor deposition), are known to one of ordinary skill in the art of integrated circuit fabrication. Referring to FIG. 6, the interconnect opening 202 is filled with a second conductive material 216 that is typically grown from the seed layer 214 in an electroplating process. Electroplating processes for filling the interconnect opening 202 with conductive material 216 are known to one of ordinary skill in the art of integrated circuit fabrication.

In an aspect of the present invention, the first conductive material of the seed layer 214 and the second conductive material 216 filling the interconnect opening 202 are comprised of a bulk metal, such as copper for example. In addition, according to an aspect of the present invention, at least one of the first conductive material of the seed layer 214 and the second conductive material 216 filling the interconnect opening 202 is comprised of a metal alloy having an alloy dopant in the bulk metal.

For example, when the bulk metal is copper, one of the first conductive material of the seed layer 214 or the second conductive material 216 filling the interconnect opening 202 may be comprised of a copper alloy with the alloy dopant being one of indium, tin, zirconium, strontium, calcium, barium, cerium, lanthanum, hafnium, and yttrium, or any other rare earth element. Such an alloy has low solid solubility (less than 0.1 atomic percent) in copper at room temperature, forms an intermetallic compound with copper, and forms a more stable metal oxide with a higher heat of formation than copper oxide.

In one embodiment of the present invention, the first conductive material of the seed layer 214 and the second conductive material 216 filling the interconnect opening 202 are comprised of copper as the bulk metal. The seed layer 214 is comprised of a metal alloy of copper indium (CuIn) with indium being the alloy dopant with a concentration of from about 0.5 atomic percent to about 4 atomic percent. In this case, the second conductive material 216 filling the interconnect opening 202 is comprised of substantially pure copper.

In another embodiment of the present invention, the second conductive material 216 filling the interconnect opening 202 is comprised of a metal alloy of copper indium (CuIn) with indium being the alloy dopant with a concentration of from about 0.1 atomic percent to about 2 atomic percent. In this case, the first conductive material of the seed layer 214 is comprised of substantially pure copper. Processes for deposition of such materials is known to one of ordinary skill in the art of integrated circuit fabrication.

Figure 7:
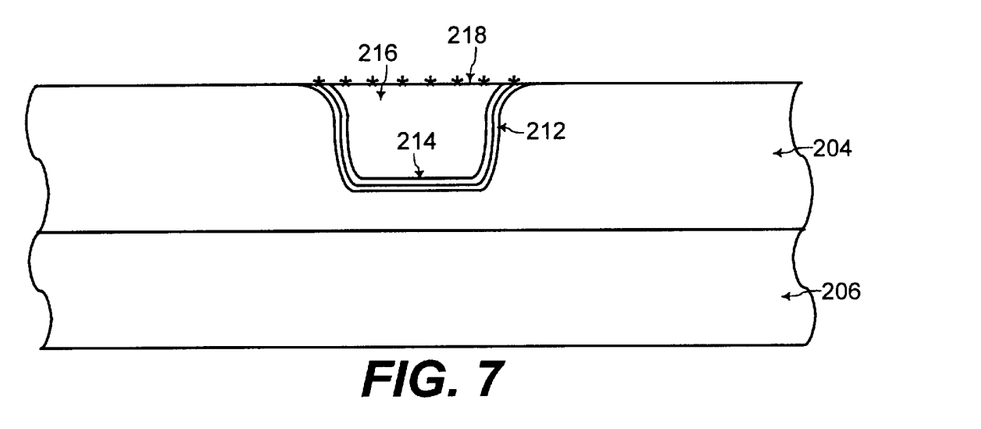

Referring to FIG. 7, the top surface of the structures on the semiconductor wafer 206 is polished down typically using a CMP (Chemical Mechanical Polishing) process. Typically, a pre-CMP anneal is performed to ensure consistency of density of copper across the semiconductor wafer 206 before such a polishing process, as known to one of ordinary skill in the art of integrated circuit fabrication. The pre-CMP anneal is typically performed at a temperature in a range of from about 150° Celsius to about 350° Celsius for a time period of from about a few minutes to about one hour, as known to one of ordinary skill in the art of integrated circuit fabrication.

With such a polishing process, the first conductive material of the seed layer 214 and the second conductive material 216 are polished off from the insulating layer 204 to be confined within the interconnect opening 202. The first conductive material of the seed layer 214 and the second conductive material 216 within the interconnect opening 202 forms a conductive fill within the interconnect opening 202. CMP (Chemical Mechanical Polishing) processes are known to one of ordinary skill in the art of integrated circuit fabrication.

Further referring to FIG. 7, after the polishing process, the top surface 218 of the conductive fill of the interconnect opening is exposed. As known to one of ordinary skill in the art of integrated circuit fabrication, typically after a CMP process, residue of native metal oxide and/or native metal hydroxide (as illustrated by the "*" in FIG. 7) remains on the top surface 218 of the conductive fill. "Native" metal oxide and "native" metal hydroxide refers to metal oxide and metal hydroxide that forms uncontrollably from reactants in the ambient, as known to one of ordinary skill in the art of integrated circuit fabrication.

Figure 8:
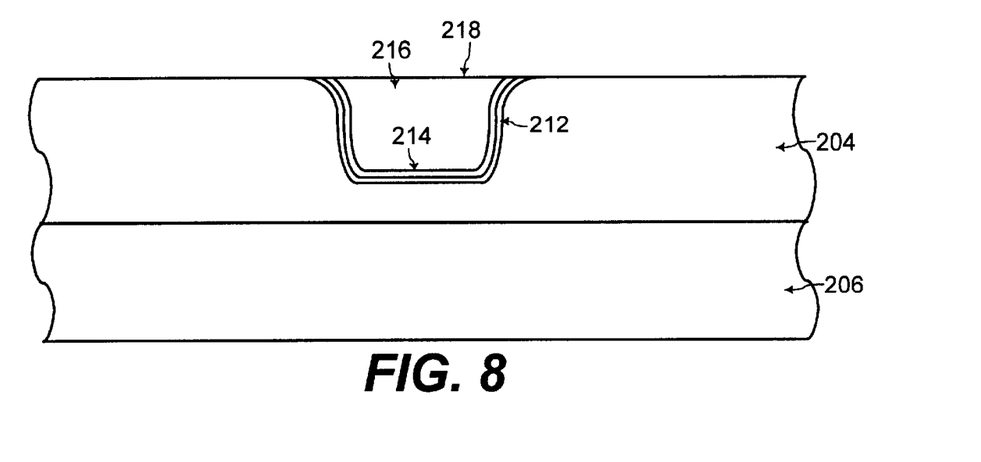
Figure 9:
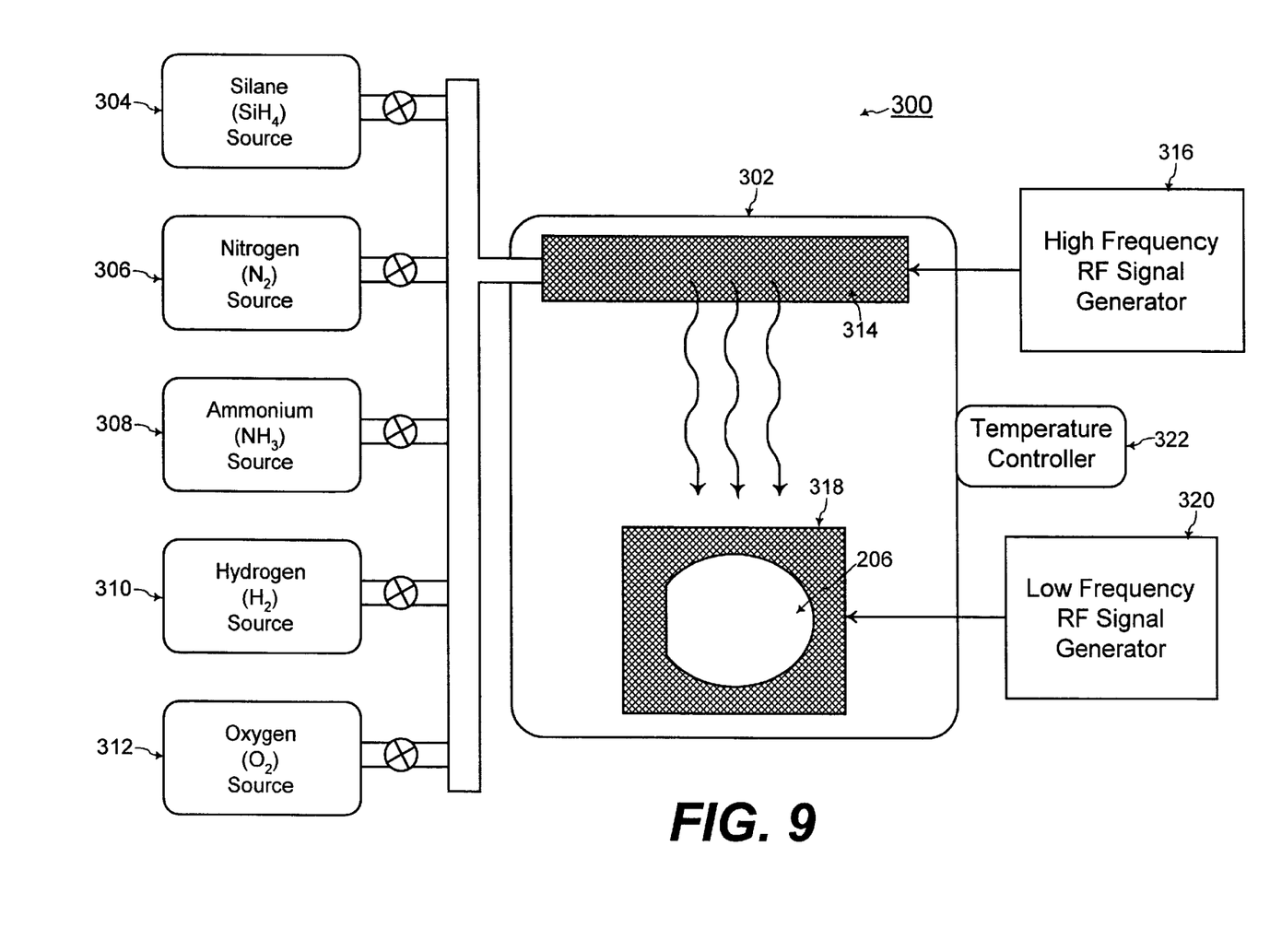
FIG. 9 illustrates the components of a plasma reaction system used for fabrication of the interconnect of the embodiments of the present invention.

Referring to FIGS. 7, 8, and 9, the semiconductor wafer 206 is placed in a plasma reaction system 300. Referring to FIG. 9, the plasma reaction system 300 includes a plasma reaction chamber 302. A silane ($SiH_4$) source 304, a nitrogen ($N_2$) source 306, an ammonium ($NH_3$) source 308, a hydrogen ($H_2$) source 310, and an oxygen ($O_2$) source 312 are coupled to the plasma reaction chamber 302. Silane ($SiH_4$) gas flows from the silane ($SiH_4$) source 304 into the plasma reaction chamber 302. Nitrogen ($N_2$) gas flows from the nitrogen ($N_2$) source 306 into the plasma reaction chamber 302. Ammonium ($NH_3$) gas flows from the ammonium ($NH_3$) source 308 into the plasma reaction chamber 302. Hydrogen ($H_2$) gas flows from the hydrogen ($H_2$) source 310 into the plasma reaction chamber 302. Oxygen ($O_2$) gas flows from the oxygen ($O_2$) source 312 into the plasma reaction chamber 302. Each of the reactant sources 304, 306, 308, 310, and 312 are coupled to a respective valve that turns the flow of the respective reactant gas on or off and that controls the respective flow rate of the respective reactant gas, as known to one of ordinary skill in the art of integrated circuit fabrication.

The plasma reaction chamber 302 further includes a showerhead 314 which is fed with silane gas from the silane ($SiH_4$) source 304, nitrogen ($N_2$) gas from the nitrogen ($N_2$)

source 306, ammonium (NH$_3$) gas from the ammonium (NH$_3$) source 308, hydrogen (H$_2$) gas flows from the hydrogen (H$_2$) source 310, or oxygen (O$_2$) gas from the oxygen (O$_2$) source 312. In addition, a high frequency RF signal generator 316 is operatively coupled to the showerhead 314. A high frequency RF signal from the high frequency RF signal generator 316 is applied to the showerhead 314 for producing the plasma in the plasma reaction chamber 302. Plasma reaction chambers in general and such a mechanism for producing plasma within a plasma reaction chamber are known to one of ordinary skill in the art of integrated circuit fabrication.

The plasma reaction chamber 302 further includes a heating block 318 which holds the semiconductor wafer 206. The heating block 318 is heated up to a predetermined temperature to maintain the semiconductor wafer 206 at a predetermined temperature. In addition, a low frequency RF signal generator 320 is operatively coupled to the heating block 318. A low frequency RF signal from the low frequency RF signal generator 320 is applied to the heating block 318 holding the semiconductor wafer 206 such that a voltage bias appears on the heating block 318. Such voltage bias on the heating block 318 attracts the plasma generated by the showerhead 314 toward the semiconductor wafer 206. Thus, plasma from the showerhead 314 is present near the semiconductor wafer 206 during the plasma enhanced reactions of the present invention.

Furthermore, the plasma reaction chamber 302 further includes a chamber temperature controller 322. The temperature controller 322 maintains the temperature within the plasma reaction chamber 302 to be at a predetermined setting.

Referring to FIGS. 7, 8, and 9, for removing the native metal oxide and/or native metal hydroxide residue at the top surface of the conductive fill, while the semiconductor wafer 206 is placed on the heating block, a plasma is generated with ammonium (NH$_3$) gas from the ammonium (NH$_3$) source 308 and/or hydrogen (H$_2$) gas from the hydrogen (H$_2$) source 310 as reducing agents. Such plasma reduces and removes the native metal oxide and/or native metal hydroxide from the top surface of the conductive fill in a plasma treatment process. Such a plasma treatment process and various parameter settings of the plasma reaction system 300 for reducing the native metal oxide and/or native metal hydroxide from the top surface of the conductive fill are known to one of ordinary skill in the art of integrated circuit fabrication.

Figure 10:
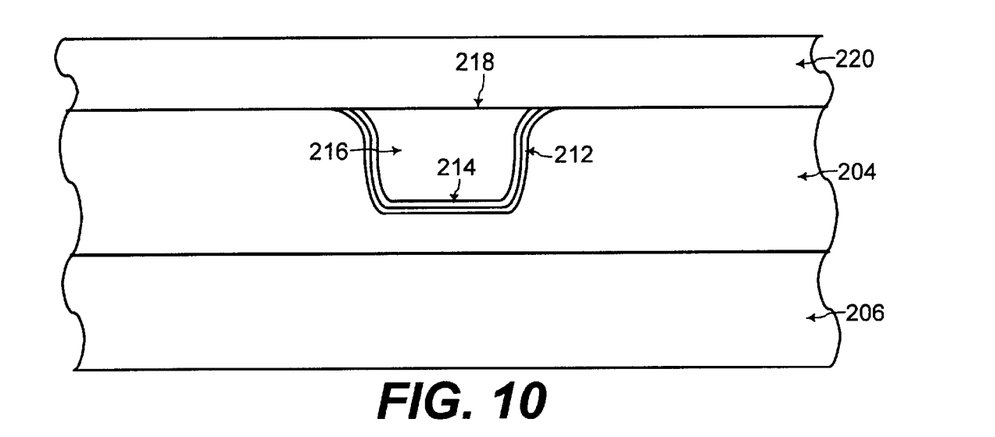
FIGS. 10 and 11 show cross-sectional views for formation of an interconnect to illustrate process steps for forming a passivation material of an intermetallic compound that is self-aligned on the top surface of the conductive fill of the interconnect to prevent drift of material of the conductive fill into an insulating layer surrounding the interconnect opening, according to a first embodiment of the present invention.

After this plasma treatment process, in a first embodiment of the present invention, a passivation material of an intermetallic compound is formed at the top surface of the conductive fill of the interconnect opening 202. Referring to FIG. 10, in this first embodiment of the present invention, a layer of bulk passivation material 220 is formed over the top surface 218 of the conductive fill of the interconnect opening 202. In an aspect of the present invention, referring to FIGS. 9 and 10, the layer of bulk passivation material 220 is formed "in-situ" within the plasm reaction chamber 302 while the semiconductor wafer 206 is on the heating block 318 without the semiconductor wafer 206 being removed from the plasma reaction chamber 302 after the plasma treatment process.

In a preferred embodiment of the present invention, the layer of bulk passivation material 220 is comprised of silicon nitride (Si$_3$N$_4$). After the plasma treatment process of FIGS. 7 and 8, the appropriate reactants (i.e. the silane (SiH$_4$) from the silane (SiH$_4$) source 304 and the nitrogen (N$_2$) gas from the nitrogen (N$_2$) source 306) flow to the showerhead 314 for forming the silicon nitride (Si$_3$N$_4$) of the layer of bulk passivation material 220 in a PVD (plasma vapor deposition) process. PVD (plasma vapor deposition) processes and various parameter settings of the plasma reaction system 300 for forming the silicon nitride (Si$_3$N$_4$) of the layer of bulk passivation material 220 are known to one of ordinary skill in the art of integrated circuit fabrication.

Figure 11:
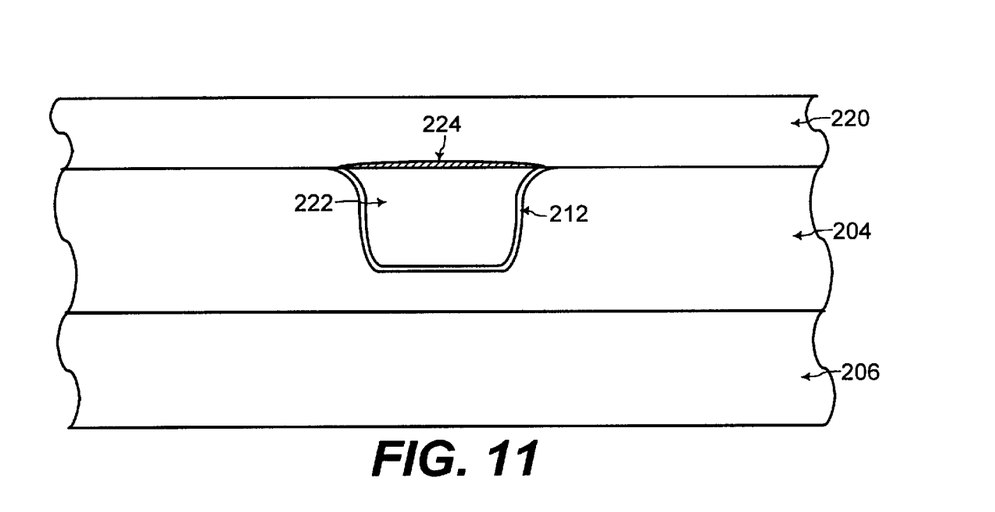

Referring to FIGS. 10 and 11, after formation of the layer of bulk passivation material 220 that encapsulates the conductive fill within the interconnect opening 202, an anneal is performed by heating up the semiconductor wafer 206 to a temperature in a range of from about 250° Celsius to about 400° Celsius for a time period in a range of from about 5 minutes to about 30 minutes. Thermal anneal processes are known to one of ordinary skill in the art of integrated circuit fabrication. In one embodiment of the present invention, the semiconductor wafer 206 may be heated up in this manner during a portion of the PVD (plasma vapor deposition) process for forming the layer of bulk passivation material 220 such that the thermal anneal process is performed simultaneously with a portion of the PVD (plasma vapor deposition) process for forming the layer of bulk passivation material 220.

During this thermal anneal process, the first conductive material of the seed layer 214 and the second conductive material 216 recrystallize into a single grain conductive fill 222 such that the boundary between the seed layer 214 and the second conductive material 216 is no longer noticeable. The single grain structure of the conductive fill 222 minimizes resistance of the interconnect such that the speed performance of the integrated circuit having the interconnect of the present invention is enhanced. In addition, during the thermal anneal, the alloy dopant of the conductive fill within the interconnect opening 202 segregates out of the conductive fill to the top surface of the conductive fill and forms an intermetallic compound 224 from a reaction of the alloy dopant with the bulk metal at an interface between the layer of bulk passivation material 220 and the top surface 218 of the conductive fill.

For the example of the bulk metal being copper and one of the first conductive material of the seed layer 214 or the second conductive material 216 being comprised of copper indium, indium as an alloy dopant segregates out and to the top surface of the conductive fill 222 to form a copper indium intermetallic compound 224. The copper indium intermetallic compound 224 has a higher ratio of indium than in the conductive fill 222 and effectively prevents drift of copper from the conductive fill 222. Thus, the copper indium intermetallic compound 224 is an additional passivation material (aside from just the layer of bulk passivation material 220) that encapsulates the copper of the conductive fill 222 to be contained within the interconnect opening 202 to further prevent drift of copper along the bottom surface 226 of the layer of bulk passivation material 220 and into the surrounding insulating layer 204.

In addition, the intermetallic compound 224 is formed from a reaction of the alloy dopant that segregates out and to the top surface of the conductive fill 222 with the bulk metal of the conductive fill 222 such that the intermetallic compound 224 is formed to be self-aligned over substantially only the top surface of the conductive fill 222. In an aspect of the first embodiment of the present invention, the intermetallic compound 224 is formed in a thermal anneal process after the layer of bulk passivation material 220 is formed to encapsulate the conductive fill. In this manner, the intermetallic compound 224 is formed with the conductive fill 222 being exposed to substantially zero oxygen. Exposure of the conductive fill 222 to substantially zero oxygen is desired during formation of the intermetallic compound 224 since the presence of oxygen may undesirably form copper oxide or indium oxide instead of the copper indium intermetallic compound 224.

Figure 12:
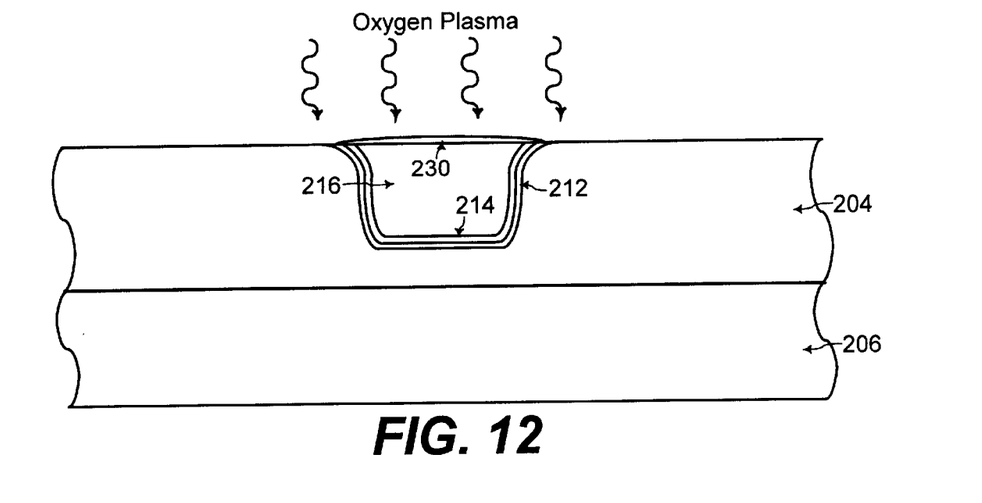
FIGS. 12 and 13 show cross-sectional views for formation of an interconnect to illustrate process steps for forming a passivation material of a metal oxide that is self-aligned on the top surface of the conductive fill of the interconnect to prevent drift of material of the conductive fill into an insulating layer surrounding the interconnect opening, according to a second embodiment of the present invention.

Referring to FIGS. 8 and 12, after the plasma treatment process of FIG. 8, in a second embodiment of the present invention, a passivation material of a metal oxide is formed at the top surface of the conductive fill of the interconnect opening 202. Referring to FIG. 12, in this second embodiment of the present invention, after the plasma treatment process of FIG. 8, the semiconductor wafer 206 is heated up, and the top surface of the conductive fill is exposed to an oxygen plasma.

Referring to FIGS. 9 and 12, in this second embodiment of the present invention, after the semiconductor wafer 206 is placed in the plasma reaction chamber 302, oxygen ($O_2$) gas from the oxygen ($O_2$) source 312 flows into the plasma reaction chamber 302 with a flow rate in a range of from about 800 sccm (standard cubic cm per minute) to about 1000 sccm (standard cubic cm per minute). In addition, the temperature within the plasma reaction chamber 302 is set to be from about 250° Celsius to about 400° Celsius via the temperature controller 322.

A high frequency RF signal is applied on the showerhead 314 from the high frequency RF signal generator 316. In an embodiment of the present invention, the high frequency RF signal applied on the showerhead 314 has a power in a range of from about 100 Watts to about 200 Watts and has a frequency in a range of from about 10 MHz to about 16 MHz. Additionally, a low frequency RF signal is applied on the heating block 318 that holds the semiconductor wafer 206. In an embodiment of the present invention, the low frequency RF signal is generated from the low frequency RF signal generator 320 with a power in a range of from about 400 Watts to about 500 Watts, preferably at 450 Watts, and with a frequency in a range of from about 280 kHz to about 420 KHz.

The low frequency RF signal applied to the heating block 318 creates a voltage bias on the heating block 318. Such voltage bias on the heating block 318 attracts the plasma generated by the showerhead 314 toward the semiconductor wafer 206. Thus, plasma from the showerhead 314 is present near the semiconductor wafer 206. The plasma reaction chamber 302 has a predetermined volume such that pressure within the plasma reaction chamber is in a range of from about 4.0 torr to about 6.0 torr, preferably about 5.0 torr. A non-volatile gas such as helium gas may flow through the plasma reaction chamber 302 to control the pressure within the plasma reaction chamber.

With the above-mentioned conditions within the plasma reaction chamber 302, the high frequency RF signal from the high frequency RF signal generator 316 and the low frequency RF signal from the low frequency RF signal generator 320 are applied for a time period of from about 10 seconds to about 60 seconds. Referring to FIG. 12, the top surface of the conductive fill of the interconnect opening 202 is exposed to oxygen plasma from the showerhead 314 for such a time period.

Referring to FIG. 12, when the top surface of the conductive fill of the interconnect opening 202 is exposed to oxygen plasma, any low quality native metal oxide is sputtered off, and a high quality metal oxide 230 that is more dense than native metal oxide forms on the top surface of the conductive fill from a reaction of the oxygen plasma with the alloy dopant that segregates to the top surface of the conductive fill. During formation of the metal oxide 230, as the alloy dopant is consumed at the top surface of the conductive fill, more alloy dopant segregates out to the top surface of the conductive fill formed by the first conductive material of the seed layer 214 and the second conductive material 216.

Figure 13:
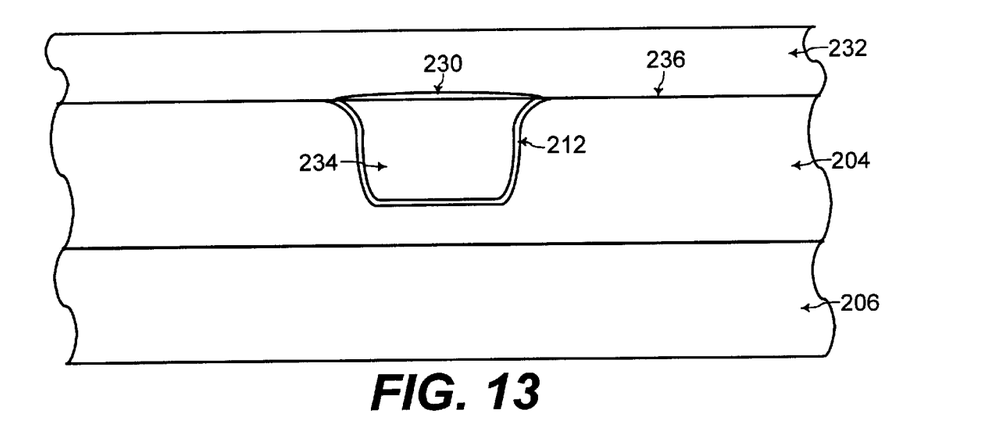

For the example of the bulk metal being copper and one of the first conductive material of the seed layer 214 or the second conductive material 216 being comprised of copper indium, indium as an alloy dopant segregates out and to the top surface of the conductive fill to form indium oxide 230. Referring to FIG. 14, after formation of the metal oxide 230, a layer of bulk passivation material 232 is deposited over the metal oxide 230. In one embodiment of the present invention, the layer of bulk passivation material 232 is comprised of silicon nitride ($Si_3N_4$). Processes for forming the silicon nitride ($Si_3N_4$) of the layer of bulk passivation material 232 are known to one of ordinary skill in the art of integrated circuit fabrication.

Further referring to FIG. 14, a thermal anneal process may be performed to heat up the semiconductor wafer 206. When the semiconductor wafer 206 is heated up, the first conductive material of the seed layer 214 and the second conductive material 216 recrystallize into a single grain conductive fill 234 such that the boundary between the seed layer 214 and the second conductive material 216 is no longer noticeable. The single grain structure of the conductive fill 234 minimizes resistance of the interconnect such that the speed performance of the integrated circuit having the interconnect of the present invention is enhanced. Thermal anneal processes are known to one of ordinary skill in the art of integrated circuit fabrication.

In this manner, due to the higher heat of formation for forming the indium oxide with an oxygen plasma, the indium oxide 230 is denser than silicon nitride ($Si_3N_4$) of the layer of bulk passivation material and has a relatively strong adhesion to the top surface of the conductive fill 234. Thus, the metal oxide 230 is an additional passivation material (aside from just the layer of bulk passivation material 232) that encapsulates the copper of the conductive fill 234 to be contained within the interconnect opening 202 to further prevent drift of copper along the bottom surface 236 of the layer of bulk passivation material 232 and into the surrounding insulating layer 204. In addition, the metal oxide 230 is formed from a reaction of oxygen plasma with the alloy dopant that segregates out and to the top surface of the conductive fill 234 such that the metal oxide 230 is formed to be self-aligned over substantially only the top surface of the conductive fill 234.

The foregoing is by way of example only and is not intended to be limiting. For example, the present invention is described for formation of copper interconnect. However, the present invention may be practiced for preventing drift of material from other types of interconnects into the surrounding insulating layer, as would be apparent to one of ordinary skill in the art of integrated circuit fabrication from the description herein. Any material specified herein is by way of example only.

Furthermore, as will be understood by those skilled in the art, the structures described herein may be made or used in the same way regardless of their position and orientation. Accordingly, it is to be understood that terms and phrases such as "top," "bottom," and "sidewalls" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for filling an interconnect opening of an integrated circuit, said interconnect opening being within an insulating layer on a semiconductor wafer, the method including the steps of:

A. depositing a seed layer of a first conductive material conformally onto sidewalls and a bottom wall of said interconnect opening;

B. filling said interconnect opening with a second conductive material by growing said second conductive material from said seed layer to form a conductive fill of said first conductive material and said second conductive material within said interconnect opening;

wherein said first conductive material and said second conductive material are comprised of a bulk metal;

and wherein at least one of said first conductive material and said second conductive material is a metal alloy having an alloy dopant in said bulk metal;

C. polishing away said first conductive material and said second conductive material from said insulating layer surrounding said interconnect opening such that said conductive fill is contained within said interconnect opening;

D. performing a plasma treatment process by placing said semiconductor wafer within a plasma reaction chamber with a reducing agent to remove any native metal oxide or native metal hydroxide from a top surface of said conductive fill;

E. forming a layer of bulk passivation material over said top surface of said conductive fill in a PVD (plasma vapor deposition) process while said semiconductor wafer is placed within said plasma reaction chamber after said step D; and F. performing an anneal by heating up said semiconductor wafer after said step E such that said alloy dopant of said conductive fill segregates out of said conductive fill to said top surface of said conductive fill to form an intermetallic compound from a reaction of said alloy dopant with said bulk metal at an interface between said layer of bulk passivation material and said top surface said conductive fill;

wherein said intermetallic compound is formed with said conductive fill being exposed to substantially zero oxygen since said layer of bulk passivation material covers said conductive fill during said anneal of said step F;

and wherein said intermetallic compound is formed to be self-aligned over substantially only said top surface of said conductive fill to prevent drift of said bulk metal of said conductive fill along a bottom surface of said layer of bulk passivation material.

2. The method of claim 1, wherein said bulk metal is copper, and wherein said first conductive material of said seed layer is comprised of a copper alloy with said alloy dopant being indium.

3. The method of claim 2, further including the step of:
depositing a diffusion barrier layer conformally onto said sidewalls and said bottom wall of said interconnect opening before said step A of depositing said seed layer.

4. The method of claim 2, wherein said insulating layer is comprised of silicon dioxide ($SiO_2$), and wherein said layer of bulk passivation material is comprised of silicon nitride ($Si_3N_4$).

5. The method of claim 1, wherein said bulk metal is copper, and wherein said second conductive material grown from said seed layer is comprised of a copper alloy with said alloy dopant being indium.

6. The method of claim 5, further including the step of:
depositing a diffusion barrier layer conformally onto said sidewalls and said bottom wall of said interconnect opening before said step A of depositing said seed layer.

7. The method of claim 5, wherein said insulating layer is comprised of silicon dioxide ($SiO_2$), and wherein said layer of bulk passivation material is comprised of silicon nitride ($Si_3N_4$).

8. The method of claim 1, wherein said reducing agent used in said plasma treatment process in said step D includes plasma generated from one of ammonium ($NH_3$) or hydrogen ($H_2$).

9. The method of claim 1, wherein said step F of performing said anneal includes heating said semiconductor wafer to a temperature in a range of from about 250° Celsius to about 400° Celsius for a time period in a range of from about 5 minutes to about 30 minutes.

10. The method of claim 1, wherein said step F of heating said semiconductor wafer is performed in said plasma reaction chamber simultaneously with said step D and said step E.

11. A method for filling an interconnect opening of an integrated circuit, said interconnect opening being within an insulating layer on a semiconductor wafer, the method including the steps of:

A. depositing a seed layer of a first conductive material conformally onto sidewalls and a bottom wall of said interconnect opening;

B. filling said interconnect opening with a second conductive material by growing said second conductive material from said seed layer to form a conductive fill of said first conductive material and said second conductive material within said interconnect opening;

wherein said first conductive material and said second conductive material are comprised of a bulk metal;

and wherein at least one of said first conductive material and said second conductive material is a metal alloy having an alloy dopant in said bulk metal;

C. polishing away said first conductive material and said second conductive material from said insulating layer surrounding said interconnect opening such that said conductive fill is contained within said interconnect opening;

D. performing a plasma treatment process by placing said semiconductor wafer within a plasma reaction chamber with a reducing agent to remove any native metal oxide or native metal hydroxide from a top surface of said conductive fill;

E. exposing said top surface of said conductive fill to oxygen plasma to form a metal oxide on said top surface of said conductive fill from a reaction of said oxygen plasma with said alloy dopant that segregates to said top surface of said conductive fill during said reaction; and F. forming a layer of bulk passivation material over said metal oxide formed on said top surface of said conductive fill;

wherein said metal oxide is formed to be self-aligned over substantially only said top surface of said conductive fill to prevent drift of said bulk metal of said conductive fill along a bottom surface of said layer of bulk passivation material.

12. The method of claim 11, wherein said bulk metal is copper, and wherein said first conductive material of said seed layer is comprised of a copper alloy with said alloy dopant being indium.

13. The method of claim 12, further including the step of:
depositing a diffusion barrier layer conformally onto said sidewalls and said bottom wall of said interconnect opening before said step A of depositing said seed layer.

14. The method of claim 12, wherein said insulating layer is comprised of silicon dioxide ($SiO_2$), and wherein said layer of bulk passivation material is comprised of silicon nitride ($Si_3N_4$).

15. The method of claim 11, wherein said bulk metal is copper, and wherein said second conductive material grown from said seed layer is comprised of a copper alloy with said alloy dopant being indium.

16. The method of claim 15, further including the step of:
depositing a diffusion barrier layer conformally onto said sidewalls and said bottom wall of said interconnect opening before said step A of depositing said seed layer.

17. The method of claim 15, wherein said insulating layer is comprised of silicon dioxide ($SiO_2$), and wherein said layer of bulk passivation material is comprised of silicon nitride ($Si_3N_4$).

18. The method of claim 11, wherein said reducing agent used in said plasma treatment process in said step D includes plasma generated from one of ammonium ($NH_3$) or hydrogen ($H_2$).

19. The method of claim 11, wherein said step E includes the steps of:

placing said semiconductor wafer on a heating block in said plasma reaction chamber;

flowing oxygen gas to a showerhead of said plasma reaction chamber with a flow rate of from about 800 sccm (standard cubic cm per minute) to about 1000 sccm (standard cubic cm per minute);

setting a temperature within said plasma reaction chamber from about 250° Celsius to about 400° Celsius;

applying a high frequency RF signal on said showerhead with a power in a range of from about 100 Watts to about 200 Watts and with a frequency in a range of from about 10 MHz to about 16 MHz;

applying a low frequency RF signal on said heating block with a power in a range of from about 400 Watts to about 500 Watts and with a frequency in a range of from about 280 KHz to about 420 KHz;

setting a pressure within said plasma reaction chamber at from about 4.0 torr to about 6.0 torr; and exposing said top surface of said conductive fill to said oxygen plasma for a time period of from about 10 seconds to about 60 seconds.

\* \* \* \* \*